(12) United States Patent
Kim

(10) Patent No.: US 8,944,875 B2
(45) Date of Patent: Feb. 3, 2015

(54) METHOD OF MANUFACTURING A DISPLAY DEVICE

(71) Applicant: Samsung Display Co., Ltd., Yongin, Gyeonggi-Do (KR)

(72) Inventor: Sun-Ho Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/197,102

(22) Filed: Mar. 4, 2014

(65) Prior Publication Data
US 2014/0256206 A1 Sep. 11, 2014

(30) Foreign Application Priority Data

Mar. 8, 2013 (KR) .................. 10-2013-0025138

(51) Int. Cl.
*H05B 33/10* (2006.01)
(52) U.S. Cl.
CPC ...................................... *H05B 33/10* (2013.01)
USPC ................................................ 445/25; 445/24
(58) Field of Classification Search
USPC ................. 313/498–512; 445/24–25
See application file for complete search history.

(56) References Cited

U.S. PATENT DOCUMENTS

| 2010/0203296 | A1 | 8/2010 | Tsai et al. | |
| 2013/0256629 | A1* | 10/2013 | Lee et al. | 257/13 |
| 2013/0329366 | A1* | 12/2013 | Wang et al. | 361/704 |
| 2014/0030857 | A1* | 1/2014 | Lee et al. | 438/158 |
| 2014/0060726 | A1* | 3/2014 | Stehle et al. | 156/236 |
| 2014/0190550 | A1* | 7/2014 | Loh et al. | 136/244 |
| 2014/0217356 | A1* | 8/2014 | Bayram et al. | 257/13 |
| 2014/0220764 | A1* | 8/2014 | Bayram et al. | 438/458 |
| 2014/0231270 | A1* | 8/2014 | Loh et al. | 205/674 |

FOREIGN PATENT DOCUMENTS

| KR | 10-2011-0031864 A | 3/2011 |
| KR | 10-2011-0084110 A | 7/2011 |

OTHER PUBLICATIONS

French, et al., *58.4: Invited Paper: Flexible Displays and Electronics Made in AM-LCD Facilities by the EPLaR™ Process*, SID 07 DIGEST, 2007, pp. 1680-1683.
Lee, et al., *54.1: Invited Paper: A Novel Approach to Make Flexible Active Matrix Displays*, SID 10 DIGEST, 2010, pp. 810-813.
Utsunomiya, et al., *36.2: Low Temperature Poly-Si TFTs on Plastic Substrate Using Surface Free Technology by Laser Ablation/Annealing (SUFTLA™)*, SID 00 DIGEST, 2000, pp. 916-919.

* cited by examiner

*Primary Examiner* — Donald Raleigh
(74) *Attorney, Agent, or Firm* — Christie, Parker & Hale, LLP

(57) ABSTRACT

A method for manufacturing a display device includes forming a releasing layer including graphene on a support substrate, forming a thin film substrate on the releasing layer, forming pixels and an encapsulation member on the thin film substrate, and separating the releasing layer and the support substrate from the thin film substrate.

9 Claims, 5 Drawing Sheets

METHOD OF MANUFACTURING A DISPLAY DEVICE

CROSS-REFERENCE TO RELATED APPLICATION

This application claims priority to and the benefit of Korean Patent Application No. 10-2013-0025138 filed in the Korean Intellectual Property Office on Mar. 8, 2013, the entire content of which is incorporated herein by reference.

BACKGROUND

1. Field

The described technology relates to a method of manufacturing a display device.

2. Description of the Related Art

An organic light emitting diode display includes organic light emitting elements including a hole injection electrode, an organic emission layer, and an electron injection electrode. Each organic light emitting element emits light by the energy generated when an exciton, which is generated by combining an electron and a hole in the organic emission layer, falls from an exited state to a lower state. The organic light emitting diode display displays an image by using this light emission.

To make the size of the OLED display slim, a display substrate of the OLED display is formed with a thin glass substrate. In this case, a support substrate supports the glass substrate so as to prevent the thin glass substrate from being bent or warped during a manufacturing process.

The display substrate is formed in the support substrate, and then the support substrate is separated from the display substrate.

However, the display substrate may be damaged or torn when separating the support substrate from the display substrate.

The above information disclosed in this Background section is provided for enhancement of understanding of the background of the described technology, and therefore it may contain information that does not form the prior art that may be already known in this country to a person of ordinary skill in the art.

SUMMARY

The described technology provides for a method of manufacturing a display device that enables a display substrate to be easily fixed to a support substrate, and easily separated from the display substrate.

A method of manufacturing a display device according to an embodiment of the present invention may include forming a releasing layer including graphene on a support substrate, forming a thin film substrate on the releasing layer, forming pixels and an encapsulation member on the thin film substrate, and separating the releasing layer and the support substrate from the thin film substrate.

The forming the releasing layer may include forming the graphene by reduction from graphene oxide.

The forming the releasing layer may include forming the graphene by forming a graphene layer and transferring the graphene to the support substrate.

The releasing layer may have a thickness of about 0.3 nm to about 2.5 nm.

The thin film substrate may include at least one of a polymer substrate or a thin film glass substrate.

The polymer substrate may include at least one of polyimide, polycarbonate, polyacrilate, polyetherimid, polyethersulfone, polyethylene terephthalate, or polyethylene naphthalate.

A thickness of the thin film glass substrate may be about 50 μm to about 200 μm.

The separating the releasing layer and the support substrate from the thin film substrate may include cutting the thin film substrate into a display panel portion and a non-display panel portion, and lifting the display panel portion of the thin film substrate from the releasing layer.

The cutting the thin film substrate may be performed with a laser beam generator or a diamond wheel cutter.

DETAILED DESCRIPTION

Figure 1:
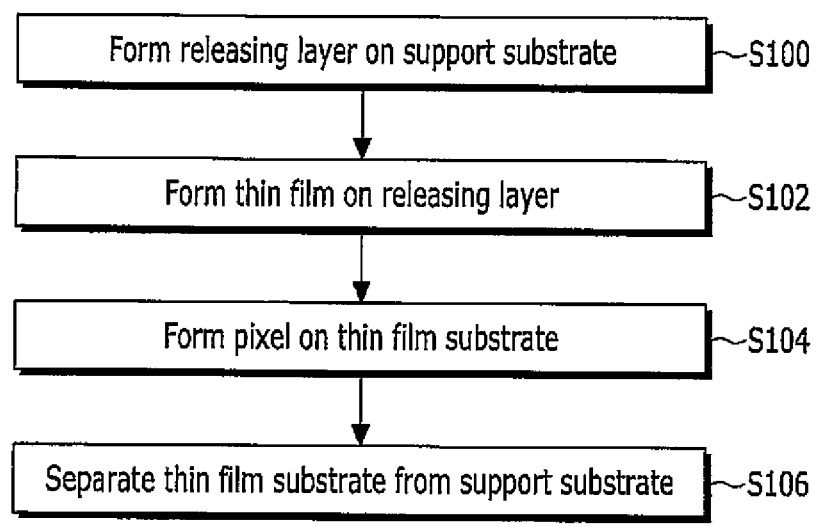
FIG. 1 is a flowchart of a method of manufacturing a display device according to an embodiment of the present disclosure.

Embodiments of the present invention will be described with reference to the accompanying drawings, in which various embodiments of the present invention are shown. As those skilled in the art would realize, the described embodiments may be modified in different ways without departing from the spirit or scope of the present invention.

The drawings and description are to be regarded as illustrative in nature and not restrictive. Like reference numerals designate like elements throughout the specification.

Furthermore, as the size and thickness of the respective structural components shown in the drawings are illustrated arbitrarily for explanatory convenience, the embodiments of present invention are not necessarily limited to the features as illustrated.

In the drawings, the thickness of layers, films, panels, regions, etc., may be exaggerated for clarity. For understanding and ease of description, the thickness of some layers and areas may be exaggerated. It will be understood that when an element such as a layer, film, region, or substrate is referred to as being "on" another element, it can be directly on the other element, or one or more intervening elements may also be present.

Unless explicitly described to the contrary, the word "comprise" and variations such as "comprises" or "comprising", will be understood to imply the inclusion of stated elements but not necessarily imply the exclusion of any other elements. Further, in the specification, when an upper part of a target portion is mentioned, it may mean an upper part or a lower part of a target portion, and does not mean that the target portion is always positioned at the upper side based on the direction of gravity.

A method of manufacturing a display device according to an embodiment of the present invention will be described in detail with reference to the drawings.

FIG. 1 is a flowchart of a method of manufacturing a display device according to an embodiment of the present disclosure.

As shown in FIG. 1, the method of manufacturing the display device according to embodiments of the present invention includes forming a releasing layer on a support substrate (S100), forming a thin film on the releasing layer (S102), forming a pixel including a thin film transistor on the thin film substrate (S104), and separating the thin film substrate from the support substrate (S106).

Hereinafter, the method of manufacturing the display device will be described in further detail according to the flowchart of FIG. 1 with reference to FIG. 2 to FIG. 6.

FIGS. 2 to 6 are cross-sectional views showing the method of manufacturing a display device according to an embodiment of the present disclosure. FIG. 7 is a layout view of a display device manufactured according to an embodiment of the present disclosure.

Figure 2:
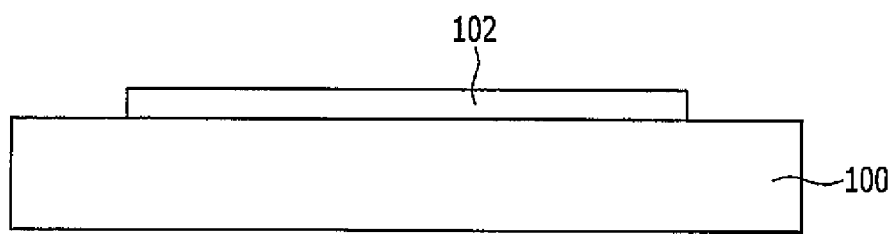
FIG. 2 to FIG. 6 are cross-sectional views showing a method of manufacturing a display device according to an embodiment of the present disclosure.

As shown in FIG. 2, a support substrate 100 is prepared, and a releasing layer 102 is formed on the support substrate 100 (S100).

The support substrate 100 is provided to prevent a thin film substrate from being bent by supporting the thin film substrate. For example, the thin film substrate may be made of solid glass.

The releasing layer 102 may be made of, for example, graphene, and is a layer provided to ease separating of the thin film substrate. The thickness of the releasing layer 102 may be, for example, approximately 0.3 nm to approximately 2.5 nm.

Graphene is formed of single-layered or multi-layered carbon atoms coupled by covalent bonds. According to an embodiment, each carbon atom layer is formed based on a six-membered cycle as a basic iteration unit, and may further include a five-membered cycle or a seven-membered cycle.

According to an embodiment of the present disclosure, the releasing layer 102 may be formed by spin-coating a dispersion liquid of a graphene oxide, and by using a thermo-reduction process or a chemical reduction process. Alternatively, the releasing layer 102 may be formed using a polymer substrate. For example, graphene may be grown on a metal layer made of, for example, Cu or Ni that is formed on a metal foil made of Cu or Ni on the support substrate 100. The grown graphene may be attached to the polymer substrate such as polydimethylsiloxane (PDMS) or poly(methylmethacrylate) (PMMA). The graphene remaining on the polymer substrate after eliminating the metal foil or the metal layer may be transferred to the support substrate 100 from the polymer substrate to form the releasing layer 102.

Figure 3:
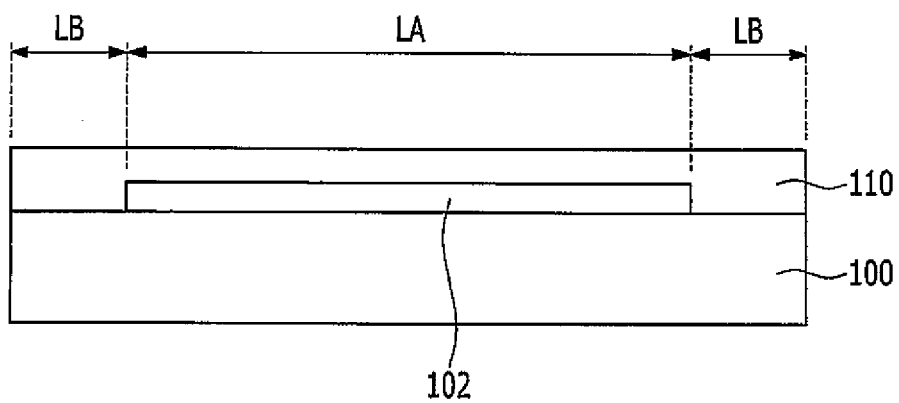

According to an embodiment of the present invention shown in FIG. 3, the thin film substrate 110 including a first area LA and a second area LB is placed on the releasing layer 102. The thin film substrate 110 may be a flexible substrate made of, for example, a polymer material or a micro-thin glass substrate.

According to an embodiment, the first area LA is an area where pixels are located, and the second area LB is the periphery area of the pixels. The first area LA is the portion that corresponds to the releasing layer 102, and the second area LB is the portion that corresponds to the portion of the support substrate 100 that is outside of, or beyond, the releasing layer 102.

In some embodiments, the polymer material may be formed by coating a liquid type polymer material, and thermally curing the coated polymer material. By way of example and not of limitation, the polymer material may be, polyimide, polycarbonate, polyacrilate, polyetherimide, polyethersulfone, polyethylene terephthalate, and polyethylene naphthalate. In some embodiments, the polyimide can be used in a high process temperature (e.g., over 450° C.) to reduce or minimize deterioration of a characteristic of a thin film transistor that may occur during manufacture of the thin film transistor.

Since the polymer substrate may bend or may expand by heat, a thin film pattern such as, for example, a thin film transistor, a light emission element, and a conductive wire might not be accurately formed on the polymer substrate. Thus, the thickness of the thin glass substrate may be approximately 50 μm to approximately 200 μm to avoid being damaged during movement. Therefore, according to an embodiment of the present invention, post processing may be performed when the thin film substrate 100 is on the support substrate 100.

Figure 4:
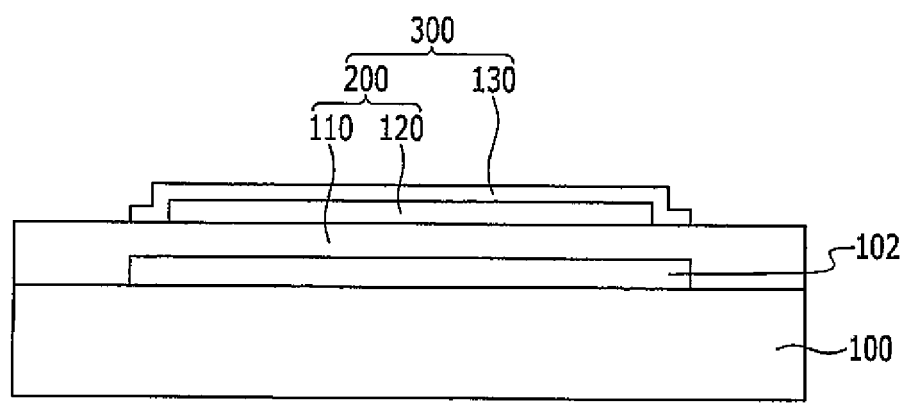

According to an embodiment of the present invention, as shown in FIG. 4, a display panel 300 including pixels 120 and an encapsulation member 130 is formed on the thin film substrate 110. The display panel 300 includes an organic light emitting substrate 200, which includes the thin film substrate 110 and the pixels 120, and the encapsulation member 130 disposed on the organic light emitting substrate 200.

As shown in FIG. 7, the pixels 120 are formed on the thin film substrate 110, and may be arranged in a matrix format. Further, the organic light emitting substrate 200 includes a display area PA and a periphery area PB.

In some embodiments, the display area (PA) is formed along one direction, and includes a first signal line 21 for transmitting a scan signal, a second signal line 71 crossing the first signal line 21 for transmitting an image signal, and pixels 120 that are connected with the first and second signal lines 21 and 71 to display an image, and that are arranged in a matrix format. The pixels 120 may also receive various signals other than the signals applied by the first and second signal lines 21 and 71.

In some embodiments of the present invention, each pixel 120 includes a thin film transistor and an organic light emitting element which receive signals from the first and second signal lines 21 and 71 to display an image.

In some embodiments of the present invention, the organic light emitting element is controlled by a driver, and displays an image by emitting light according to a driving signal.

In some embodiments of the present invention, the periphery area PB includes a driver 510 connected with the first signal line 21 or the second signal line 71, to transmit an external signal thereto. The driver 510 may be mounted on the thin film substrate, for example, as an IC chip, or may be integrated to the substrate together with a transistor of a display unit.

The example embodiment shown in FIG. 4 illustrates the pixels 120 as one layer for better understanding and ease of description.

In some embodiments, the encapsulation member 130 may be formed of a plurality of layers. The encapsulation member 130 may include at least one of an inorganic layer or an organic layer, and the inorganic layer and the organic layer may be layered alternatingly and/or iteratively. By way of example and not of limitation, the inorganic layer may include an aluminum oxide or a silicon oxide, and the organic layer may include epoxy, acrylate, urethane acrylate, or the like.

In some embodiments, the inorganic layer may reduce or prevent permeation of moisture or oxygen into the organic light emitting element. The organic layer functions to release an internal stress of the inorganic layer, or to fill micro cracks and pin holes in the inorganic layer. The material of the inorganic layer and the organic layer are not necessarily limited to the above-stated material, and other types of inorganic and organic layers known to a person skilled in the art may be used.

In some embodiments, the encapsulation member 130 may cover the pixel 120 to prevent the pixel 120 from being exposed to the outside.

In some embodiments, a barrier layer may be disposed between the pixel 120 and the thin film substrate 110. The barrier layer may block or reduce the inflow of undesired external elements, such as moisture or oxygen, into the pixel 120. The barrier layer may include at least one of an organic layer or an inorganic layer, and the organic layer and the inorganic layer may be alternatingly layered and/or iteratively layered.

Figure 5:
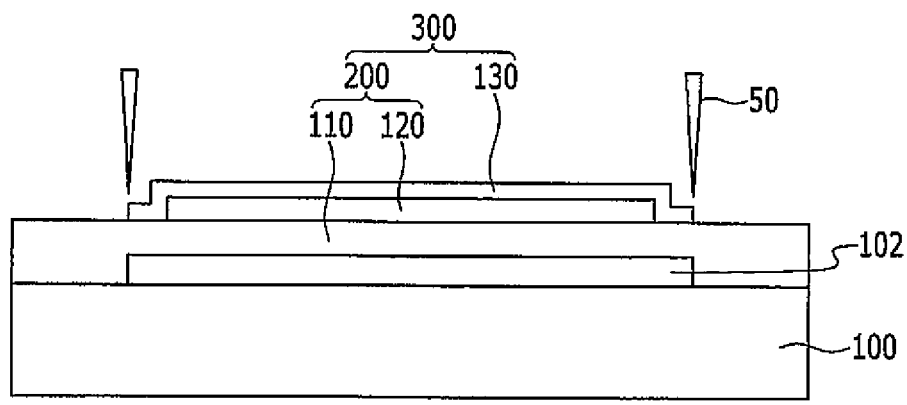

According to an embodiment of the present invention, as shown in FIG. 5, the thin film substrate 110 is cut using laser beams produced by a laser beam generator 50 to divide the thin film substrate 110 into a display panel portion and a non-display panel portion(s).

To separate the support substrate from the thin film substrate, according to an embodiment of the present disclosure, one or more laser beams are irradiated to a boundary line between the first area LA and the second area LB using the laser beam generator 50. A device for separating the first area LA and the second area LB may not necessarily be limited to the laser beam generator 50. For example, a diamond wheel cutter may be used.

Figure 6:
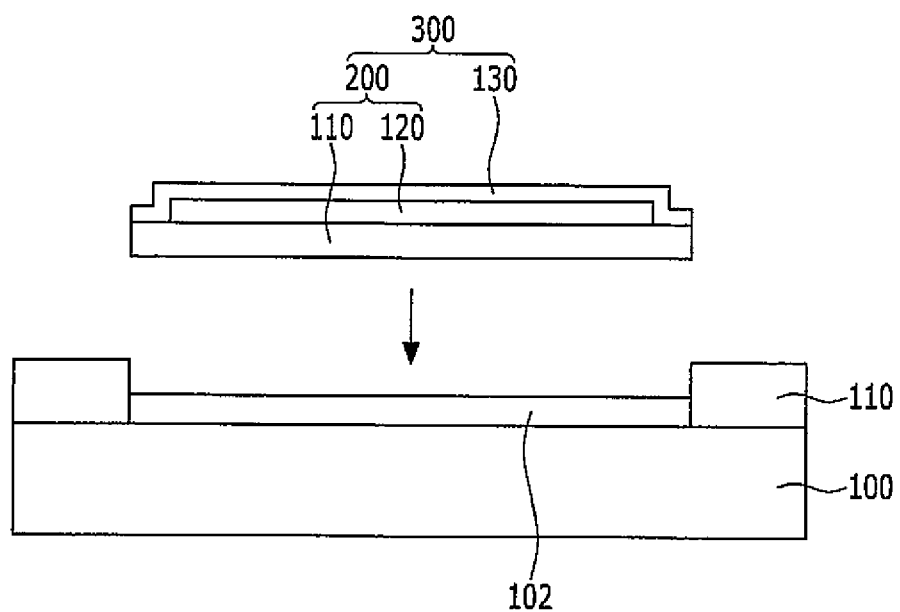
Figure 7:
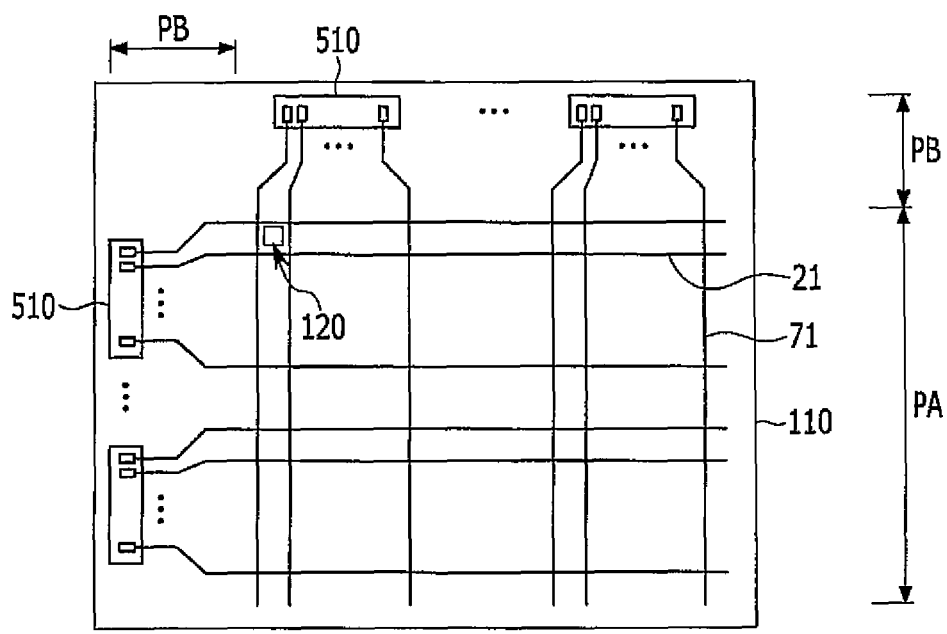
FIG. 7 is a layout view of a display device according to an embodiment of the present disclosure.

According to an embodiment of the present disclosure, the support substrate 100 is separated from the thin film substrate 110, as shown in FIG. 6.

The releasing layer 102 according to the present embodiment may be formed of graphene (although it is not limited to graphene), and therefore the support substrate 100 can be easily separated from the thin film substrate 110 by hand, for example.

That is, for example, when the thin film substrate 110 is made of glass, the thin film substrate 110 may be strongly coupled together with the support substrate 100 by a silanol group, but in contrast, as described in embodiments of the present disclosure, when the releasing layer 102 is formed of graphene, unwanted coupling between the thin film substrate 110 and the support substrate 100 can be prevented or reduced. In addition, when the thin film substrate 110 is made of a polymer material such as polyimide, coupling between polyimide and the support substrate 100 can be prevented or reduced by a low surface energy of graphene.

Because graphene has high thermal stability, deformation does not occur to a great extent at a relatively high temperature. Therefore, the display panel 300 is also not deformed even though the display panel 300 is exposed to high-temperature processes for forming the pixels 120, for example, a process for crystallizing amorphous silicon, a dehydrogenation process, and the like, thereby preventing the display panel 300 from being wrinkled or warped, or reducing the extent thereof.

The method of manufacturing the display device according to the described embodiments of the present disclosure can be used to easily separate the display substrate and the support substrate 100 by using graphene as the releasing layer 102.

While this disclosure has been described in connection with what is presently considered to be practical embodiments, it is to be understood that the embodiments of the present invention are not limited to the disclosed embodiments, but, to the contrary, is intended to cover various modifications and equivalent arrangements included within the spirit and scope of the appended claims and their equivalents.

| DESCRIPTION OF SOME OF THE REFERENCE CHARACTERS | |
|---|---|
| 100: support substrate | 102: releasing layer |
| 110: thin film substrate | 120: pixel |
| 130: sealing member | 200: organic light emitting substrate |
| 300: display panel | |

What is claimed is:

1. A method for manufacturing a display device, the method comprising:
   forming a releasing layer comprising graphene on a support substrate;
   forming a thin film substrate on the releasing layer;
   forming pixels and an encapsulation member on the thin film substrate; and
   separating the releasing layer and the support substrate from the thin film substrate.

2. The method for manufacturing the display device of claim 1, wherein the forming the releasing layer comprises forming the graphene by reduction from graphene oxide.

3. The method for manufacturing the display device of claim 1, wherein the forming the releasing layer comprises forming the graphene by forming a graphene layer and transferring the graphene to the support substrate.

4. The method for manufacturing the display device of claim 1, wherein the releasing layer has a thickness of about 0.3 nm to about 2.5 nm.

5. The method for manufacturing the display device of claim 1, wherein the thin film substrate comprises at least one of a polymer substrate or a thin film glass substrate.

6. The method for manufacturing the display device of claim 5, wherein the polymer substrate comprises at least one of polyimide, polycarbonate, polyacrilate, polyetherimide, polyethersulfone, polyethylene terephthalate, or polyethylene naphthalate.

7. The method for manufacturing the display device of claim 5, wherein a thickness of the thin film glass substrate is about 50 µm to about 200 µm.

8. The method for manufacturing the display device of claim 1, wherein the separating the releasing layer and the support substrate from the thin film substrate comprises:
   cutting the thin film substrate into a display panel portion and a non-display panel portion; and
   lifting the display panel portion of the thin film substrate from the releasing layer.

9. The method for manufacturing the display device of claim 8, wherein the cutting the thin film substrate is performed with a laser beam generator or a diamond wheel cutter.

* * * * *